United States Patent [19]

Noguier et al.

[11] Patent Number: 4,695,863
[45] Date of Patent: Sep. 22, 1987

[54] GATELESS PROTECTION THYRISTOR WITH A THICK, HEAVILY DOPED CENTRAL N-LAYER

[75] Inventors: Jean P. Noguier, St. Cyr sur Loir; Jean P. Montaut, Tours, both of France

[73] Assignee: Thomson CSF, Paris, France

[21] Appl. No.: 838,934

[22] Filed: Mar. 12, 1986

[30] Foreign Application Priority Data

Mar. 12, 1985 [FR] France ............... 85 03626

[51] Int. Cl.$^4$ .......................................... H01L 29/74
[52] U.S. Cl. .......................................... 357/38; 357/13; 357/39; 357/89
[58] Field of Search .................. 357/13, 38, 39, 89, 357/90

[56] References Cited

U.S. PATENT DOCUMENTS

| | | | |
|---|---|---|---|
| 3,099,591 | 7/1963 | Shockley | 357/38 |
| 3,123,750 | 3/1964 | Hutson et al. | 357/39 |
| 3,236,698 | 2/1966 | Shockley | 357/38 |
| 3,312,880 | 4/1967 | Longo et al. | 357/38 |
| 3,341,749 | 9/1967 | Shields et al. | 357/38 |
| 3,389,224 | 6/1968 | Schimmer | 357/38 |
| 3,442,722 | 5/1969 | Bauerlein et al. | 357/64 |
| 3,515,615 | 10/1970 | Howell et al. | 357/39 |
| 3,766,450 | 10/1973 | Voss et al. | 357/38 |
| 3,774,085 | 11/1973 | Platzoeder et al. | 357/38 |

Primary Examiner—Joseph E. Clawson, Jr.
Attorney, Agent, or Firm—Cushman, Darby & Cushman

[57] ABSTRACT

The invention relates to gateless thyristors and triacs used for protecting against over voltages. In order to obtain a high holding current without adversely affecting the current resistance capacities of the thyristor or the triac, a special impurity concentration profile is provided, in which the P type layer under the cathode layer has a very small thickness (less than 10 microns).

3 Claims, 5 Drawing Figures

GATELESS PROTECTION THYRISTOR WITH A THICK, HEAVILY DOPED CENTRAL N-LAYER

BACKGROUND OF THE INVENTION

1. Field of the Invention

The invention relates to semiconductor components and more particularly to elements for protecting against over voltages.

2. Description of the Prior Art

The use of thyristors without gate electrodes has recently been proposed for protecting circuits against over voltages appearing between two terminals of the circuit; the thyristor is placed between these two terminals; it is normally disabled but becomes conducting if the voltage at its terminals exceeds a given threshold; it then diverts a considerable current and prevents destruction of the circuit to be protected. If the circuit is to be protected against positive and negative over voltages, a protection triac without gate electrodes will be used.

The applicant has discovered that the gateless thyristors or triacs which may be used as elements for protecting against over currents must have electric characteristics different from those which are required of thyristors or triacs used in other applications and more particularly in controlled current switching.

In particular, protective triacs must be capable of withstanding extremely high current flows for short times (time required for the over voltages to disappear); on the other hand, a controlled switching triac must first of all be capable of withstanding the dissipation of a high mean power before being capable of diverting a high transitory power. Furthermore, a protection triac must preferably have a fairly high holding current; the holding current is the value of the current which flows through the triac and below which the triac can no longer remain conducting and becomes disabled; on the contrary, a triac used for controlled switching must most frequently have as low a holding current as possible; in fact, the triac used for controlled switching is much better controlled if it is disabled at a time as close as possible to the zero cross over of the current. On the contrary, the protection triac must be disabled rapidly after disappearance of the over voltage and in particular, if its holding current were too low, it would risk remaining conducting even after return to a normal value of the voltage between the terminals of the circuit to be protected (particularly when these terminals are the supply terminals of the circuit).

A conventional triac structure is shown in FIG. 1. The thicknesses of the layers are perfectly arbitary in this Figure. The structure comprises, on the same semi conductor wafer, two thyristors (without gate) TH1 and TH2 juxtaposed head to tail. Each thyristor comprises the superimposition of four alternating layers: a P type anode region (AN1 and AN2 respectively); a central N region (CE1 and CE2), but in fact the central region is common to the two thyristors and is formed by the starting substrate of the wafer); a P type gate region (GA1, GA2); an N type cathode region (CA1, CA2); the upper and lower surfaces are metallized so as to form a first electrode ME1 (cathode for the thyristor TH1 and anode for the other) and a second electrode ME2 (anode of the thyristor TH1 and cathode for the other). The periphery of the wafer is in general defined on each face by a peripheral groove which intersects the junction between the central N region and the P region adjacent this region on the side of the face considered. The groove SP1 on the upper face is covered by a passivation layer PA1 and the groove SB2 on the other face is covered by a passivation layer PA2 (glass). So called "emitter short circuit" holes CC1, CC2, may be provided: these are portions of the gate layer (GA1, GA2) which rise through the cathode layer (CA1, CA2) as far as the surface metallization (ME1, ME2).

The impurity concentrations in the different superimposed regions are generally symmetrical for the two thyristors and a concentration profile has been shown in FIG. 2 for one of the thyristors starting from one metallization (ME1) as far as the other (ME2).

The profile shown and the numerical values indicated in this profile and given below correspond to a protection triac with low holding current; in other words, in practice there has been shown in FIG. 2 the concentration profile of the layers of the conventional triac serving for controlled switching; it is in fact by using first of all conventional triacs without gate electrodes that the construction of protection triacs was begun.

In this profile there are designated by:

XJN: the depth of the junction between the cathode region CA1 and the gate region GA1 (depth with respect to the metallization ME1), XJP: the depth of the junction between the gate region GA1 and the central layer CE1 (depth with respect to the metallization ME1), WB: the "base width" of the thyristor, i.e. the width of the gate region between the central layer CE1 and the cathode region CA1; WB is equal to XJP-XJN, CSB: the maximum P type concentration in the gate region, CSC: the concentration (in general constant) in the central region CE1.

For a conventional triac with fairly low holding current, the following typical concentration profile would for example be obtained:

Profile 1:
XJN = 15 microns,
XJP = 33 microns,
WB = 18 microns,
CSB = 2 to 5 $10^{16}$ atoms/cm$^3$,
CSC = $10^{14}$ atoms/cm$^3$.

Profile 2:
XJN = 15 microns,
XJP = 50 microns,
WB = 35 microns,
CSB = 2 to 5 × $10^{16}$ atoms/cm$^3$
CSC = $10^{14}$ atoms/cm$^3$ The anode and cathode regions have much higher concentrations (at least 5 × $10^{18}$ atoms/cm$^3$).

Since these profiles do not lead to sufficient holding currents (by way of indication a holding current of 150 mA is desirable) the normal solution consists in increasing the width WB and the concentration CSB of the gate region GA1 for that reduces the resistivity of the gate region.

In fact, the triac is disabled as soon as the voltage drops generated laterally in the gate region drop below about 0.5 V. If it is desired for the triac to be disabled below a given holding current, the voltage drop must be sufficiently low for this current. The voltage drop is reduced by increasing the conductivity of the gate region, so its concentration and its width.

Thus the following typical profile was tried
Profile 3 (FIG. 3):
XJN = 22 microns, XJP = 42 microns,
WB = 20 microns,
CSB = $3 \times 10^{17}$ atoms/cm$^3$.

With this change sufficient holding currents were effectively obtained.

But the applicant discovered that the resistance to current overloads was insufficient and in particular was not proportional to the area of the semiconductor wafer. In particular, after tests it was discovered that, in order to obtain only 30% improvement in current resistance under certain conditions, it was necessary to more than double the area of the wafer (whereas conventionally it is considered that a wafer can let pass a maximum current proportional to its area).

More precisely, with a wafer having the profile 3 given above, the destruction current was measured in the presence of an over current having the following characteristics (waves 8/20): rise time 8 microseconds up to the maximum of the over current then exponentiel decrease with reduction of 50% of the current after 20 microseconds.

For a wafer of 2.25 mm$^2$ the destruction current was 170 amps; for a wafer of 5.3 mm$^2$ (+135% with respect to 2.25 mm$^2$) the destruction current was 220 amps (+30%).

SUMMARY OF THE INVENTION

The present invention provides a protection thyristor or triac structure which considerably improves the current resistance for large areas while maintaining a holding current as high as that of the above mentioned triac (profile 3).

According to the invention, the gate region has in an unexpected way a particularly small thickness WB (less than 10 microns), and a P type impurity concentration between $5 \times 10^{16}$ and $5 \times 10^{18}$ atoms per cubic centimeter approximately; the central region has an N type impurity concentration of at least $10^{16}$ atoms/cm$^3$, less than the concentration of the gate region (function of the reversal current).

DESCRIPTION OF THE PREFERRED EMBODIMENT

Figure 1:
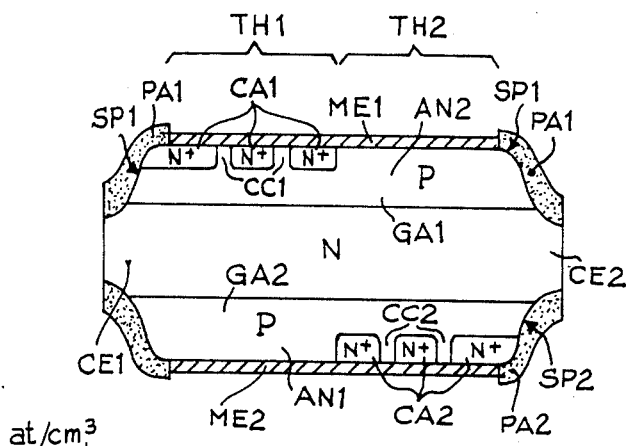
FIG. 1 already described shows a protection triac structure.
Figure 2:
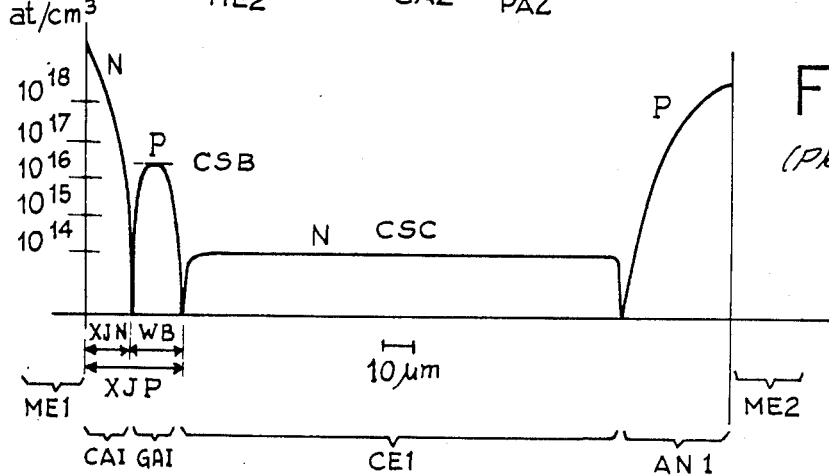
FIGS. 2 and 3 already described show concentration profiles for conventional triacs.
Figure 3:
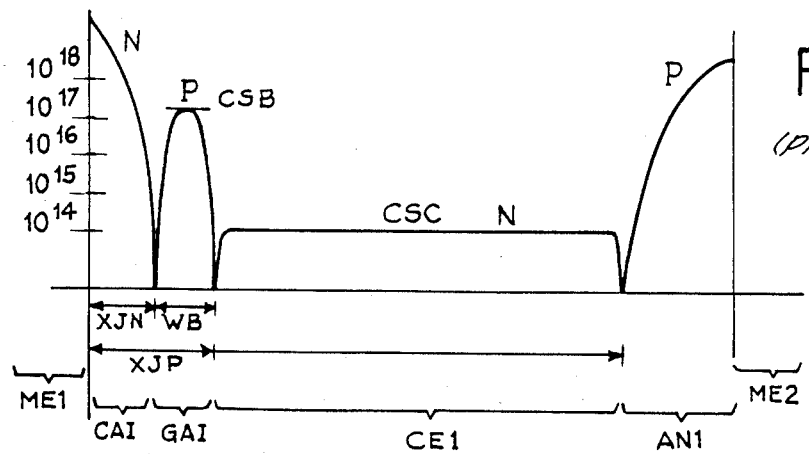

FIGS. 1 and 2 will not be described again.

Figure 4:
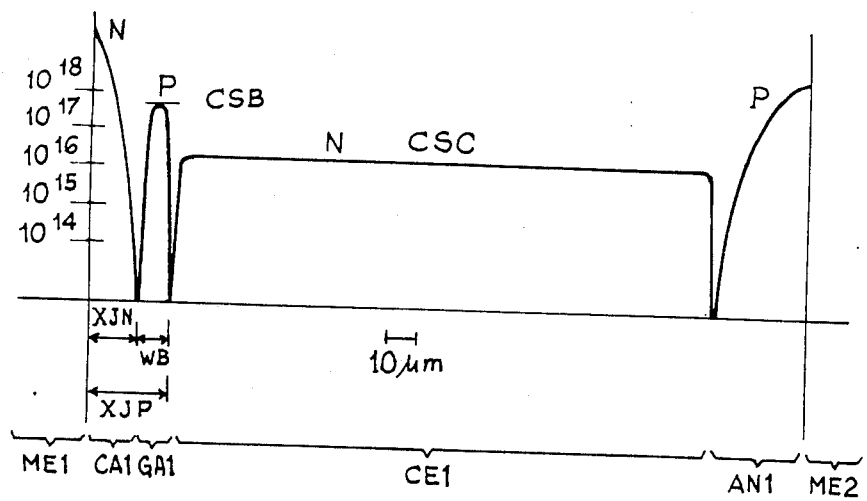
FIGS. 4 and 5 show concentration profiles for thyristors or triacs in accordance with the invention.
Figure 5:
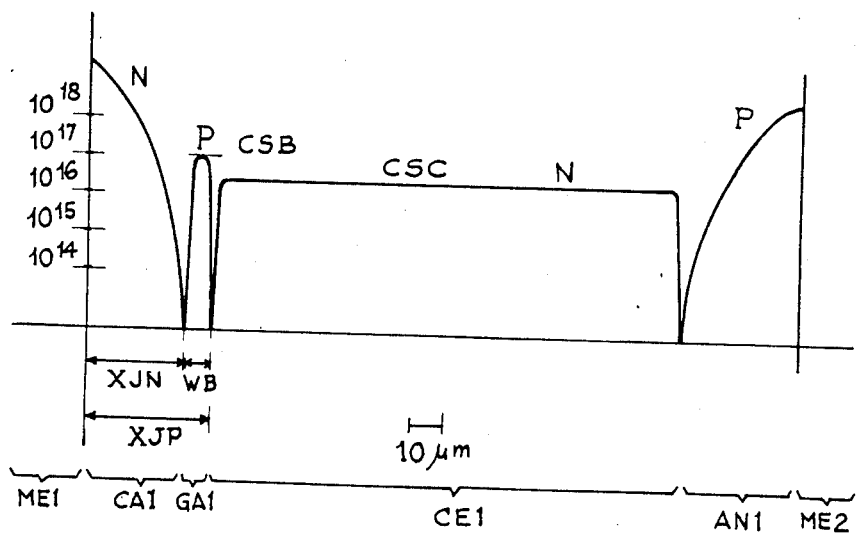

FIGS. 4 and 5 show the details of a typical concentration profile in accordance with the invention.

The table below gives two examples with corresponding numerical values:

Profile A (FIG. 4):
XJN = 18 microns,
XJP = 27 microns,
WB = 9 microns,
CSB = $6.5 \times 10^{17}$ atoms/cm$^3$ approx,
CSC = $3 \times 10^{16}$ atoms/cm$^3$ approx.

In addition, the width of region CE1 may be about 180 microns and that of region AN1 about 30 microns. The maximum concentration of regions AN1 and CA1 is greater than $5 \times 10^{18}$ atoms/cm$^3$.

Profile B (FIG. 5):
XJN = 33 microns
XJP = 41 microns,
WB = 8 microns,
CSB = $9.2 \times 10^{16}$ atoms/cm$^3$ approx,
CSC = $5 \times 10^{16}$ atoms/cm$^3$ approx.

In addition, the width of the central layer CE1 is about 160 microns and that of the region AN1 about 40 microns. The maximum concentration of regions AN1 and CA1 is again greater than ($5 \times 10^{18}$ atoms/cm$^3$).

Tests carried out for these two profiles show that a considerable improvement of the current resistance is obtained: for a wafer of 2.25 mm$^2$ (profile 4) a destruction current of 300 amps (wave 8/20) was obtained and for a wafer of 5.3 mm$^2$ (profile 5) a destruction current of 600 amps was obtained.

The holding current obtained (greater than 150 milliamps) may again be increased by doping the central layer CE1, CE2 with gold, which results in reducing the lifespan of the carriers of this layer.

Electronic irradiation may also be used for obtaining this lifespan reduction.

What is claimed is:

1. A thyristor of the type without a gate electrode, comprising:
    a semiconductor substrate, which includes the superimposition of a plurality of layers which includes (a) a heavily doped P type anode layer, (b) a slightly doped N type central layer, (c) a moderately doped P type gate layer and (d) a heavily doped N type cathode layer;
    wherein: the gate region has a thickness less than 10 microns between the cathode layer and the central layer and an impurity concentration between $5 \times 10^{16}$ atoms/cm$^3$ and $5 \times 10^{18}$ atoms/cm$^3$, and the central layer has a thickness greater than 100 microns and an impurity concentration of at least $10^{16}$ atoms/cm$^3$.

2. The thyristor as claimed in claim 1, wherein said central layer is doped with atoms tending to reduce the lifespan of the electric charge carriers in this layer.

3. The thyristor as in claim 2 where in said atoms are gold atoms.

* * * * *